United States Patent
Wang et al.

(10) Patent No.: US 11,575,110 B2
(45) Date of Patent: Feb. 7, 2023

(54) DISPLAY SUBSTRATE INCLUDING BLUE LIGHT-EMITTING UNIT WITH ITS LIGHT-EMITTING LAYER DISPOSED AT ANTI-NODE, DISPLAY PANEL, AND DISPLAY APPARATUS

(71) Applicant: BOE TECHNOLOGY GROUP CO., LTD., Beijing (CN)

(72) Inventors: Linlin Wang, Beijing (CN); Guang Yan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 71 days.

(21) Appl. No.: 17/041,339

(22) PCT Filed: Feb. 4, 2020

(86) PCT No.: PCT/CN2020/074254
§ 371 (c)(1),
(2) Date: Sep. 24, 2020

(87) PCT Pub. No.: WO2020/168904
PCT Pub. Date: Aug. 27, 2020

(65) Prior Publication Data
US 2021/0028402 A1 Jan. 28, 2021

(30) Foreign Application Priority Data
Feb. 22, 2019 (CN) .......................... 201910133378.1

(51) Int. Cl.
*H01L 51/52* (2006.01)
*H01L 27/32* (2006.01)
*H01L 51/50* (2006.01)

(52) U.S. Cl.
CPC ...... *H01L 51/5265* (2013.01); *H01L 27/3211* (2013.01); *H01L 51/5012* (2013.01);
(Continued)

(58) Field of Classification Search
CPC ............ H01L 51/5256; H01L 27/3211; H01L 51/5012; H01L 51/5218; H01L 51/5234; H01L 2251/5315; H01L 2251/558
(Continued)

(56) References Cited

U.S. PATENT DOCUMENTS

2005/0249972 A1 11/2005 Hatwar et al.
2005/0280008 A1 12/2005 Ricks et al.
(Continued)

FOREIGN PATENT DOCUMENTS

CN 101752511 A 6/2010
CN 103378123 A 10/2013
(Continued)

OTHER PUBLICATIONS

Office Action dated Jul. 1, 2020 from corresponding CN Patent Application No. 201910133378.1, 20 pages.
(Continued)

*Primary Examiner* — Xia L Cross
(74) *Attorney, Agent, or Firm* — Procopio, Cory, Hargreaves & Savitch LLP

(57) ABSTRACT

A display substrate includes a base and blue light-emitting units disposed on the base. A blue light-emitting unit includes a first electrode, a first light-emitting layer and a second electrode that are sequentially disposed on the base. Of the first electrode and the second electrode, one electrode is configured to reflect light, and another electrode is configured to transmit light. The first light-emitting layer is configured to emit light having a spectrum whose full width at half maximum is less than or equal to 16 nm.

20 Claims, 7 Drawing Sheets

(52) U.S. Cl.
CPC ...... *H01L 51/5218* (2013.01); *H01L 51/5234* (2013.01); *H01L 2251/5315* (2013.01); *H01L 2251/558* (2013.01)

(58) Field of Classification Search
USPC .......................................................... 257/89
See application file for complete search history.

(56) References Cited

U.S. PATENT DOCUMENTS

| | | | |
|---|---|---|---|
| 2010/0157131 A1 | 6/2010 | Kamatani et al. | |
| 2011/0233528 A1 | 9/2011 | Levermore et al. | |
| 2015/0008419 A1 | 1/2015 | Li | |
| 2017/0069852 A1* | 3/2017 | Kanamoto | C07F 15/0033 |
| 2017/0352828 A1 | 12/2017 | Kim et al. | |
| 2017/0373277 A1 | 12/2017 | Noh et al. | |
| 2018/0151630 A1 | 5/2018 | Yamaoka et al. | |
| 2018/0301656 A1 | 10/2018 | Ji | |
| 2019/0165051 A1* | 5/2019 | Yan | H01L 27/3209 |
| 2021/0028402 A1 | 1/2021 | Wang et al. | |
| 2021/0313534 A1* | 10/2021 | Kobashi | C09K 11/70 |
| 2021/0351364 A1* | 11/2021 | Hatakeyama | H01L 51/5024 |

FOREIGN PATENT DOCUMENTS

| | | |
|---|---|---|
| CN | 104272487 A | 1/2015 |
| CN | 105609534 A | 5/2016 |
| CN | 107112430 A | 8/2017 |
| CN | 107546333 A | 1/2018 |
| CN | 108026106 A | 5/2018 |
| CN | 108963097 A | 12/2018 |
| CN | 109830516 A | 5/2019 |
| EP | 3269720 A1 | 1/2018 |
| TW | I364448 B | 5/2012 |

OTHER PUBLICATIONS

Office Action dated Nov. 2, 2020 from corresponding CN Patent Application No. 201910133378.1, 14 pages.
Office Action dated Mar. 30, 2021 from corresponding CN Patent Application No. 201910133378.1, 11 pages.
European Patent Office. European Search Report dated Oct. 21, 2022. Application No./Patent No. 20759403.7-211 / 3929992 PCT/CN2020074254. Name of Applicant: Boe Technology Group Co., Ltd. English Language. 8 pages.

* cited by examiner

DISPLAY SUBSTRATE INCLUDING BLUE LIGHT-EMITTING UNIT WITH ITS LIGHT-EMITTING LAYER DISPOSED AT ANTI-NODE, DISPLAY PANEL, AND DISPLAY APPARATUS

CROSS-REFERENCE TO RELATED APPLICATIONS

This application is a national phase entry under 35 USC 371 of International Patent Application No. PCT/CN2020/074254 filed on Feb. 4, 2020, which claims priority to and the benefit of Chinese Patent Application No. 201910133378.1, titled "OLED substrate, display apparatus", filed on Feb. 22, 2019, which are incorporated herein by reference in their entirety.

TECHNICAL FIELD

The present disclosure relates to the field of display technologies, and in particular, to a display substrate, a display panel and a display apparatus.

BACKGROUND

Organic light emitting diode (OLED) display devices have been widely used as display devices due to their advantages such as self-illumination, high response, high contrast, easy to become flexibility and wide viewing angle.

SUMMARY

In one aspect, a display substrate is provided. The display substrate includes a base and blue light-emitting units disposed on the base. A blue light-emitting unit includes a first electrode, a first light-emitting layer and a second electrode that are sequentially disposed on the base. Of the first electrode and the second electrode, one electrode is configured to reflect light, and another electrode is configured to transmit light. The first light-emitting layer is configured to emit light having a spectrum whose full width at half maximum is less than or equal to 16 nm.

In some embodiments, the first electrode is configured to reflect light, and the second electrode is configured to transmit light.

In some embodiments, a thickness of the first light-emitting layer is 200 Å to 300 Å.

In some embodiments, in a direction perpendicular to the display substrate, a distance between a surface of the first electrode proximate to the first light-emitting layer and a surface of the second electrode proximate to the first light-emitting layer is greater than or equal to 750 Å and is less than or equal to 1700 Å.

In some embodiments, the display substrate further includes a polarizing layer disposed on a side of the blue light-emitting unit away from the base, in a direction perpendicular to the display substrate, a distance between a surface of the first electrode proximate to the first light-emitting layer and a surface of the second electrode proximate to the first light-emitting layer is greater than or equal to 800 Å and is less than or equal to 1750 Å.

In some embodiments, a thickness of the second electrode is greater than or equal to 200 Å and is less than or equal to 500 Å.

In some embodiments, a thickness of the second electrode is greater than or equal to 300 Å and is less than or equal to 350 Å.

In some embodiments, the second electrode includes a magnesium-silver alloy or a calcium-silver alloy.

In some embodiments, the first light-emitting layer is disposed at a position where a second anti-node is located between a surface of the first electrode proximate to the first light-emitting layer and a surface of the second electrode proximate to the first light-emitting layer.

In some embodiments, a distance between a surface of the first light-emitting layer proximate to the base and a surface of the first electrode away from the base is greater than or equal to 250 Å and is less than or equal to 1200 Å.

In some embodiments, a thickness of the first electrode is greater than or equal to 1000 Å and is less than or equal to 1500 Å.

In some embodiments, the first electrode includes at least one of silver, aluminum, copper, molybdenum, chromium, and titanium.

In some embodiments, the blue light-emitting unit further includes a transmission electrode disposed on a side of the first electrode proximate to the first light-emitting layer.

In some embodiments, the blue light-emitting unit further includes a hole injection layer and/or a hole transport layer that are disposed between the first electrode and the first light-emitting layer.

In some embodiments, the blue light-emitting unit further includes an electron transport layer and/or an electron injection layer that are disposed between the first light-emitting layer and the second electrode.

In some embodiments, the display substrate further includes red light-emitting units and green light-emitting units. A red light-emitting unit includes a third electrode, a second light-emitting layer, and a fourth electrode that are sequentially disposed on the base, and a fourth electrode that are sequentially provided on the base. A green light-emitting unit includes a fifth electrode, a third light-emitting layer, and a sixth electrode that are sequentially disposed on the base.

In some embodiments, the first electrode, the third electrode, and the fifth electrode are an integrated structure; or, the second electrode, the fourth electrode, and the sixth electrode are an integrated structure.

In another aspect, a display panel is provided. The display panel includes the display substrate in any one of the embodiments.

In some embodiments, the display panel further includes an encapsulating cover plate disposed opposite to the base; or, a thin film encapsulating layer disposed opposite to the base.

In yet another aspect, a display apparatus is provided. The display apparatus includes the display panel in any one of the embodiments.

BRIEF DESCRIPTION OF THE DRAWINGS

In order to describe technical solutions in the present disclosure more clearly, accompanying drawings to be used in some embodiments of the present disclosure will be introduced below briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals that the embodiments of the present disclosure relate to.

DETAILED DESCRIPTION

Figure 1:
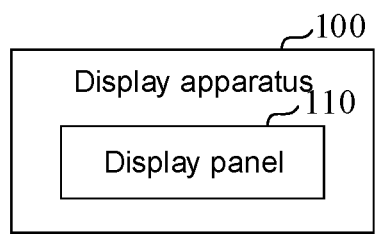
FIG. 1 is a schematic diagram showing a structure of a display apparatus, in accordance with some embodiments of the present disclosure.

Technical solutions in some embodiments of the present disclosure will be described clearly and completely in combination with accompanying drawings.

Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, the term "comprise" and other forms thereof such as the third-person singular form "comprises" and the present participle form "comprising", in the description and the claims are construed as an open and inclusive, i.e., "inclusive, but not limited to". Moreover, the term "and/or" is merely used to describe an association relationship of associated objects, which represents three kinds of relationships. For example, "A and/or B" represents three conditions: A exists alone, A and B exist simultaneously, and B exists alone.

In the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Terms such as "first" and "second" are used for descriptive purposes only and are not to be construed as indicating or implying the relative importance or implicitly indicating the number of indicated technical features below. Thus, features defined as "first" and "second" may explicitly or implicitly include one or more of the features. In the description of the embodiments of the present disclosure, terms "a plurality of" and "the plurality of" mean two or more unless otherwise specified.

In the description of some embodiments, the terms such as "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, terms such as "coupled" or "communicatively coupled" may also mean that two or more elements are not in direct contact with each other, but still cooperate or interact with each other. The embodiments disclosed herein are not necessarily limited to the contents herein.

Nowadays, there are more and more types of display apparatuses, such as desktop computers, notebook computers, mobile phones, and e-book readers. Users often use the above display apparatus in certain public places, such as internet cafes, subways, and buses. When a user uses the above display apparatus in public, if contents displayed on a screen of the display apparatus relate to contents to be kept secret, the user may not want others to see the contents displayed on the screen from a side of the screen. Therefore, demands for display apparatuses with an anti-peep function have increased.

Taking an OLED display apparatus as an example, an optical anti-peep film is provided on a surface of a screen of the OLED display apparatus, so that the OLED display apparatus has the anti-peep function. However, since the anti-peep film is provided, a thickness of the OLED display apparatus may be increased, and screen brightness may be reduced, so as to affect visual effects.

Some embodiments of the present disclosure provide a display apparatus. The display apparatus may be any product or component having a display function, such as an OLED display, an OLED television, a digital photo frame, a mobile phone, a tablet computer, or a navigator.

As shown in FIG. 1, the display apparatus 100 includes a display panel 110 for displaying an image.

For example, the display apparatus 100 may further includes a circuit for providing driving signals to the display panel 110. The circuit is, for example, a driving integrated circuit (IC).

Figure 2:
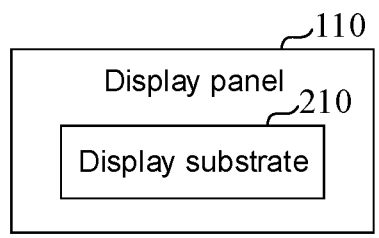
FIG. 2 is a schematic diagram showing a structure of a display panel, in accordance with some embodiments of the present disclosure.

As shown in FIG. 2, the display panel 110 includes a display substrate 210.

Figure 3A:
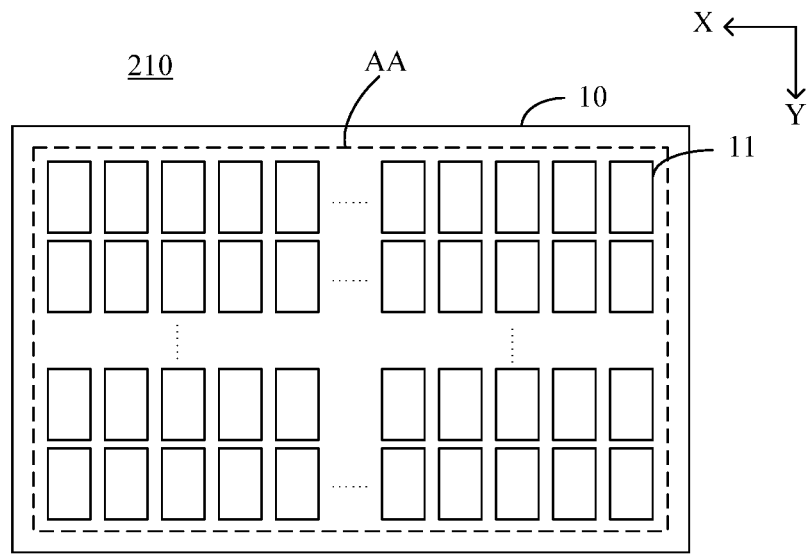
FIG. 3A is a schematic top view showing a structure of a display panel, in accordance with some embodiments of the present disclosure.

For example, as shown in FIGS. 3A and 38, the display substrate 210 includes a base 10, and a plurality of light-emitting units 11 disposed on the base 10. The plurality of light-emitting units 11 are disposed in a display area (generally referred to as an active area, AA) of the display substrate 210.

Figure 3B:
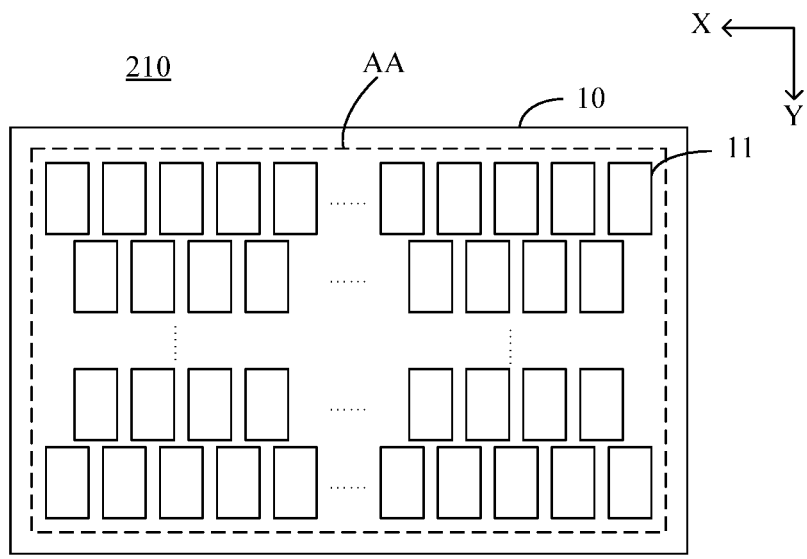
FIG. 3B is a schematic top view showing a structure of another display panel, in accordance with some embodiments of the present disclosure.

The plurality of light-emitting units 11 may be arranged in various ways. For example, as shown in FIG. 3A, the plurality of light-emitting units 11 may be arranged in an array along a row direction X and a column direction Y. Alternatively, as shown in FIG. 3B, the plurality of light-emitting units 11 may be arranged staggered along the column direction Y. That is, in every two adjacent rows of light-emitting units 11, each light-emitting unit 11 in one row of light-emitting units 11 corresponds to an interval between two adjacent light-emitting units 11 adjacent to the light-emitting unit 11 that are in another row of light-emitting units 11.

Of course, it can be understood that the arrangements shown in FIGS. 3A and 3B are merely exemplary. The arrangements of the plurality of light-emitting units 11 in some embodiments of the present disclosure include, but are not limited to, the arrangements of the plurality of light-emitting units 11 shown in FIGS. 3A and 3B, and may be adjusted according to requirements for design of different display substrates, which is not limited.

Moreover, it can also be understood that a plane shape (i.e., a rectangular shape) of the light-emitting unit 11 shown in FIGS. 3A and 3B is merely exemplary, and the plane shape of the light-emitting unit 11 may also be other shapes in addition to the rectangular shape, such as, a diamond shape, a hexagonal shape, or the like. The plane shape(s) of the plurality of light-emitting units 11 may be adjusted according to requirements for design of different display substrates, which are not limited.

Figure 4A:
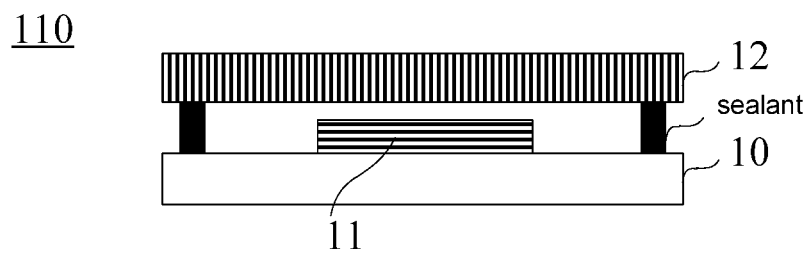
FIG. 4A is a schematic diagram showing a cross-sectional structure of a display panel, in accordance with some embodiments of the present disclosure.

Further, the light-emitting unit 11 is relatively sensitive to water vapor and oxygen in the external environment, and its service life may be reduced if it is eroded by water vapor and oxygen. Therefore, in order to prolong the service life of the light-emitting unit 11, in some embodiments of the present disclosure, as shown in FIG. 4A, the display panel 110 further includes an encapsulating cover plate 12 disposed opposite to the base 10. For example, a sealant (such as a glass adhesive) is coated around a periphery of the display area AA, and the encapsulating cover plate 12 is adhered to the base through the sealant, thereby protecting the light-emitting units 11 disposed on the base 10.

Figure 4B:
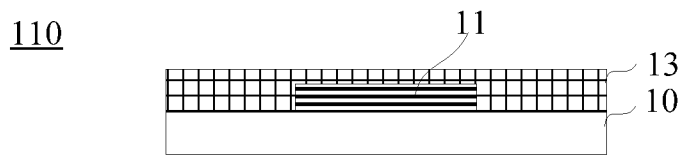
FIG. 4B is a schematic diagram showing a cross-sectional structure of another display panel, in accordance with some embodiments of the present disclosure.

In some other embodiments of the present disclosure, as shown in FIG. 4B, the display panel 110 further includes a thin film encapsulating layer 13 disposed opposite to the base 10. The thin film encapsulating layer 13 covers the light-emitting units 11 and a surface of the base 10 provided with the light-emitting units 11, thereby protecting the light-emitting units 11.

In some embodiments of the present disclosure, the base 10 of the display substrate 210 may include an initial substrate, and a transistor layer disposed on the initial substrate and used to drive the light-emitting units 11 to emit light. The transistor layer includes a plurality of transistors.

For example, the initial substrate may be a rigid substrate (such as a glass substrate) or a flexible substrate (for example, a substrate made of polyimide).

In the display substrate 210, each light-emitting unit 11 includes an anode, a light-emitting layer and a cathode that are stacked on the base 10. For example, the anode, the light-emitting layer and the cathode are arranged sequentially away from the base. Alternatively, the cathode, the light-emitting layer and the anode are arranged sequentially away from the base. The anode of each light-emitting unit 11 is electrically connected to the corresponding transistor, so that the transistor transmits an electrical signal to the corresponding light-emitting unit 11.

The principle of operation of the light-emitting unit 11 is as follows: driven by an external voltage, the anode injects holes into the light-emitting layer, and the cathode injects electrons into the light-emitting layer. The electrons and the holes meet and recombine in the light-emitting layer to form excitons in an excited state. The excitons will undergo a transition to a lower energy level due to their instability. During a transition, a portion of energy is depleted in a form of thermal energy, and another portion of energy is released in a form of light energy. The energy released in the form of light energy enables the light-emitting layer to emit light.

In actual situations, a relative position between the anode and the cathode in each light-emitting unit 11 may be designed according to requirements for circuit design of the display substrate, which is not limited in some embodiments of the present disclosure. For ease of description, an example where the anode is disposed on a side of the light-emitting layer facing the base is taken when each light-emitting unit 11 is described in the following embodiments.

Light exit modes of the light-emitting unit 11 may include a top emission mode (that is, light emitted from the light-emitting unit 11 exits from a side away from the base) and a bottom emission mode (that is, light emitted from the light-emitting unit 11 exits through the base).

In a case where the anode is disposed on the side of the light-emitting layer facing the base, if the light exit mode is the bottom emission mode, the anode is a transflective electrode, and the cathode is a reflective electrode. That is, the anode is configured to transmit light, the cathode is configured to reflect light, and light emitted by the light-emitting layer exits through the base. If the light exit mode is the top emission mode, the cathode is a transflective electrode, and the anode is a reflective electrode. That is, the cathode is configured to transmit light, the anode is configured to reflect light, and light emitted by the light-emitting layer exits through the cathode.

For one light-emitting unit 11, in a case where the light-emitting layer of the light-emitting unit 11 is located in a resonant cavity composed of a totally reflective film (such as a first electrode or a first anode in some embodiments of the present disclosure) and a semi-reflective film (such as a second electrode in some embodiments of the present disclosure) and a cavity length is in a same order of magnitude as a wavelength of a light wave, light of a specific wavelength will be selected and strengthened, that is, a spectrum will be narrowed, thereby resulting in a microcavity effect.

Figure 5:
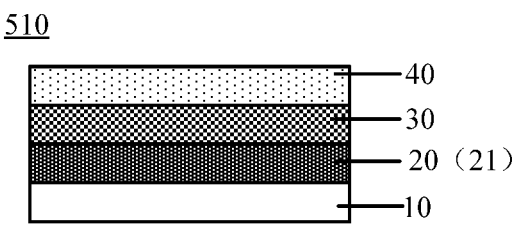
FIG. 5 is a schematic diagram showing a cross-sectional structure of a blue light-emitting unit in a display substrate, in accordance with some embodiments of the present disclosure.

Some embodiments of the present disclosure provide the display substrate 210, and the plurality of light-emitting units 11 may include a plurality of blue light-emitting units. FIG. 5 shows a blue light-emitting unit 510 in some embodiments of the present disclosure. As shown in FIG. 5, the blue light-emitting unit 510 includes a first electrode 21, a first light-emitting layer 30 and a second electrode 40 that are sequentially disposed on the base 10.

According to different light exit modes, of the first electrode and the second electrode, one electrode is configured to reflect light, and the other electrode is configured to transmit light. For example, if the light exit mode of the blue light-emitting unit is the top emission mode, the first electrode is configured to reflect light, and the second electrode is configured to transmit light. If the light exit mode of the blue light-emitting unit is the bottom emission mode, the first electrode is configured to transmit light, and the second electrode is configured to reflect light.

In the blue light-emitting unit 510 shown in FIG. 5, the first electrode is configured to reflect light, and the second electrode is configured to transmit light. A full width at half maximum (FWHM) of a spectrum of light emitted by the first light-emitting layer 30 is less than or equal to 16 nm.

As shown in FIG. 5, the first electrode 21 is, for example, a first anode 20. The first electrode 21 may include, for example, at least one of silver (Ag), aluminum (Al), copper (Cu), molybdenum (Mo), chromium (Cr), and titanium (Ti). That is, the first electrode 21 may be made of an elemental metal above, or an alloy composed of two or more metal elements above.

The second electrode 40 is configured to transmit light. The second electrode 40 may be made of, for example, a magnesium-silver (Mg—Ag) alloy (such as magnesium-silver metal compound) or a calcium-silver (Ca—Ag) alloy (such as calcium-silver metal compound). A microcavity may be formed between the first anode 20 and the second electrode 40. When the light-emitting layer emits light, light in the microcavity exhibits the microcavity effect described above.

Figure 6:
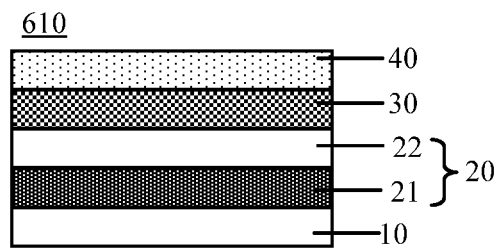
FIG. 6 is a schematic diagram showing a cross-sectional structure of a blue light-emitting unit in another display substrate, in accordance with some embodiments of the present disclosure.

Some other embodiments of the present disclosure provide another blue light-emitting unit 610. As shown in FIG. 6, a difference between the blue light-emitting unit 610 and the blue light-emitting unit 510 in the foregoing embodiments lies in that the blue light-emitting unit 610 further includes a transmission electrode 22 disposed on a side of the first electrode 21 proximate to the first light-emitting layer 30. The first electrode 21 and the transmission electrode 22 in the blue light-emitting unit 610 together constitute the first anode 20.

The transmission electrode 22 is configured to transmit light. The transmission electrode 22 may include at least one of indium zinc oxide (IZO), indium tin oxide (ITO), aluminium zinc oxide (AZO), or indium fluorine oxide (IFO).

It should be noted that, in a case where voltages are applied to the second electrode 40 and the first electrode 21, respectively, the first light-emitting layer 30 can emit blue light. A peak wavelength of light emitted by the first light-emitting layer 30 is greater than 450 nm, and generally the peak wavelength of light emitted by the first light-emitting layer 30 is from 460 nm to 470 nm.

Figure 7:
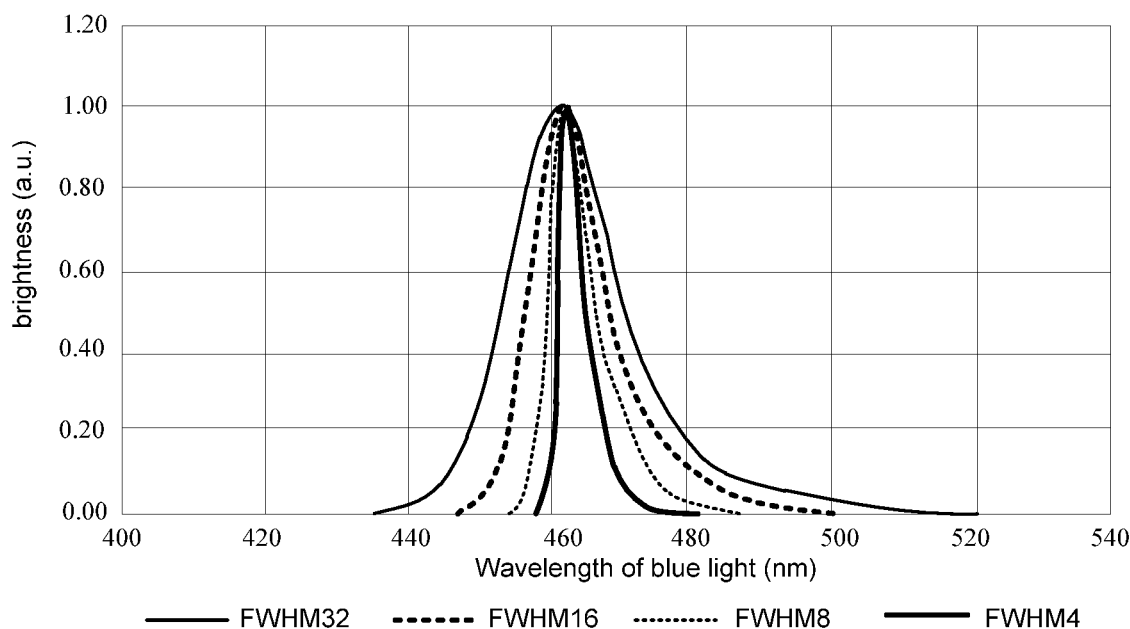
FIG. 7 is a schematic diagram showing a spectrum of blue light in a display substrate, in accordance with some embodiments of the present disclosure.

FIG. 7 shows a schematic diagram of brightness as a function of wavelength for each of four materials (labeled as FWHM32, FWHM16, FWHM8, and FWHM4 respectively in FIG. 7) with spectra having full widths at half maximum of 32 nm, 16 nm, 8 nm, and 4 nm, respectively. As shown in FIG. 7, an abscissa in FIG. 7 represents a wavelength, and an ordinate represents the brightness. A relationship between the wavelength of light emitted by one material and the brightness corresponding to the wavelength corresponds to a peak curve. One material corresponds to one full width at half maximum (FWHM). The FWHM may be obtained in a way that: if a peak height (the brightness corresponding to the peak wavelength) of a material is f, a midpoint of the peak height is f/2; a straight line perpendicular to the coordinate axis representing the brightness is made through the midpoint of the peak height, and a distance between two points where the straight line intersects the peak curve is the FWHM.

Figure 8:
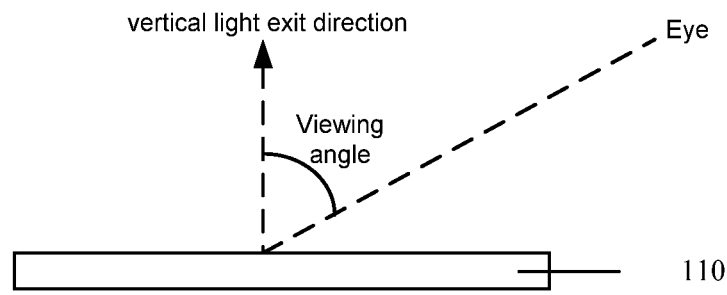
FIG. 8 is a schematic diagram showing a viewing angle relationship between a display substrate and eyes of a viewer, in accordance with some embodiments of the present disclosure.

As shown in FIG. 8, a direction perpendicular to the display panel 110 is a vertical light exit direction. When human eyes look at a certain point at any position on a screen of the display panel 110, an angle between a line of sight of a human eye (that is, an imaginary connecting line between the point and the human eye) and the vertical light exit direction is an viewing angle at which the human eye see the point. It can be understood that in a case where a distance from the human eye to the point is constant, if a position of the human eye changes, the viewing angle at which the human eye see the point also changes accordingly.

Figure 9:
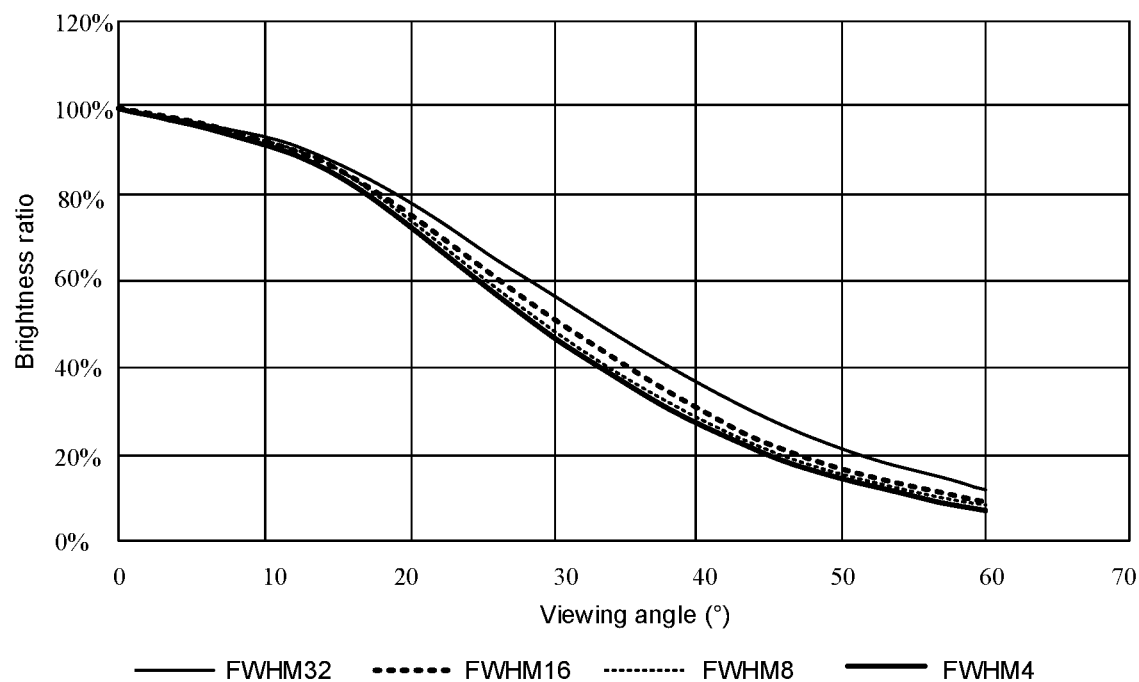
FIG. 9 is a graph showing a relationship between a viewing angle and a brightness ratio, in accordance with some embodiments of the present disclosure.

Further, as shown in FIG. 9, an abscissa in FIG. 9 represents the viewing angle, that is, the angle between the line of sight of the human eye and the vertical light exit direction of the screen as shown in FIG. 8. An ordinate in FIG. 9 represents a brightness ratio, which means that for any light-emitting point on the screen and any viewing angle, brightness of some of light rays emitted from the light-emitting point that exit in a direction of the viewing angle is first brightness, and brightness of some of light rays emitted from the light-emitting point that exit in a direction of zero viewing angle (that is, the line of sight of the human eye is parallel to the vertical light exit direction) is second brightness, and a ratio of the first brightness to the second brightness is the brightness ratio corresponding to the viewing angle.

For blue light with a peak wavelength greater than 450 nm, a change of FWHM is shown in FIG. 9. In a case where the FWHM is 32 nm, 16 nm, 8 nm or 4 nm (labeled as FWHM32, FWHM16, FWHM8, and FWHM4 respectively in FIG. 9), as the viewing angle increases, the brightness ratios corresponding to the viewing angle each gradually decrease. In a case where the FWHMs are 16 nm, 8 nm, and 4 nm, the brightness ratios have a similar decreasing trend. That is, as the viewing angle increases, on one hand, the brightness ratios of the FWHMs of 16 nm, 8 nm and 4 nm are close at a same viewing angle. On the other hand, decreasing ratios of the brightness ratios for the FWHMs of 16 nm, 8 nm and 4 nm are larger compared to a decreasing ratio of the brightness ratio for the FWHM of 32 nm. For example, in a case where the viewing angle is 20° to 60° or even greater, the brightness ratios for the FWHM of 16 nm, 8 nm and 4 nm are much smaller than the brightness ratio for the FWHM of 32 nm at a same viewing angle.

It can be seen that, in the display substrate 210 in some embodiments of the present disclosure, in a case where the FWHM of the spectrum of light emitted by the first light-emitting layer 30 is less than or equal to 16 nm, on a premise that the brightness of light exiting in the vertical light exit direction of the screen is guaranteed to enable the screen to normally display image(s), as the viewing angle of the human eye towards the screen increases, the brightness ratio of the blue light-emitting unit may gradually decrease, and the brightness ratio of blue light may gradually decrease.

Since brightness of blue light on the screen is lower than that of a normal display image, which may cause the contents of the display image on the screen not to be recognized normally in a case where the human eyes are at a position with a large viewing angle, it is possible to achieve a purpose of keeping the contents of the display image confidential and prevent the contents displayed on the screen from being recognized and stolen by a peeper.

It can be seen that a material with a spectrum having a FWHM less than or equal to 16 nm may be used as a material for the first light-emitting layer 30. For example, in a case where the FWHM is less than or equal to 16 nm, an illumination intensity (hereinafter referred to as illuminance) L0 of ambient light is usually 100 Lx to 300 Lx, brightness LP in a vertical direction (i.e., a direction perpendicular to the screen) of the screen is usually 200 nit to 300 nit, a reflectance R % of the screen is usually 5% to 8%, and a contrast CR of the ambient light of the screen is CR=LP/(L0*R %). Therefore, as the viewing angle increases, the CR gradually decreases. In a case where the viewing angle increases to above 45°, the CR may almost decrease to 20% and even to 10%, so as to achieve the anti-peep function under different viewing angles.

To enhance a light exit rate of the first light-emitting layer 30, in some embodiments, a thickness of the first light-emitting layer 30 may be 200 Å to 300 Å. For example, the thickness of the first light-emitting layer may be 220 Å, 240 Å, 250 Å, 260 Å, or 280 Å.

It can be understood that, in some embodiments of the present disclosure, other layers may be provided between the first electrode 21 and the second electrode 40.

For example, in some embodiments of the present disclosure, the blue light-emitting unit may further include a hole injection layer disposed between the first anode and the first light-emitting layer.

For example, in some embodiments of the present disclosure, the blue light-emitting unit may further include a hole transport layer disposed between the first anode and the first light-emitting layer.

For example, in some embodiments of the present disclosure, the blue light-emitting unit may further include an electron transport layer disposed between the first light-emitting layer and the second electrode.

For example, in some embodiments of the present disclosure, the blue light-emitting unit may further include an electron injection layer disposed between the first light-emitting layer and the second electrode.

Figure 10:
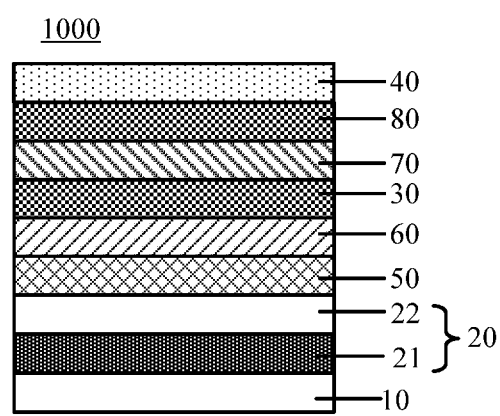
FIG. 10 is a schematic diagram showing a cross-sectional structure of yet another display substrate, in accordance with some embodiments of the present disclosure.

For example, as shown in FIG. 10, yet some embodiments of the present disclosure provide a blue light-emitting unit 1000. A difference between the blue light-emitting unit 1000 and the blue light-emitting unit 610 in the foregoing embodiments lies in that: the blue light-emitting unit 1000 further includes a hole injection layer 50 and a hole transport layer 60 that are sequentially disposed between the first anode 20 and the first light-emitting layer 30, and an electron transport layer 70 and an electron injection layer 80 that are sequentially disposed between the first light-emitting layer 30 and the second electrode 40.

Of course, it can be understood that the blue light-emitting unit 1000 shown in FIG. 10 is provided with the hole injection layer, the hole transport layer, the electron transport layer, and the electron injection layer therein, but in actual situations, according to different design requirements of the display substrate, the blue light-emitting unit is not limited to the case where the hole injection layer, the hole transport layer, the electron transport layer, and the electron injection layer are all provided in the blue light-emitting unit. The blue light-emitting unit may be provided with one or several of the hole injection layer, the hole transport layer, the electron transport layer, and the electron injection layer therein.

When the display substrate provided by some embodiments of the present disclosure is applied to a display apparatus, it is not necessary to provide an anti-peep film on the screen of the display apparatus, which may reduce a thickness of the display apparatus, and improve screen brightness and display effects of the display apparatus. In addition, since it is not necessary to provide the anti-peep film on the screen of the display apparatus, there is no need for processes such as a film cutting and a film sticking, which may simplify a manufacturing process of the display apparatus.

In order to maximize luminous intensity of light in the vertical light exit direction of the display substrate, in some embodiments of the present disclosure, a cavity length of the microcavity is greater than or equal to 750 Å and is less than or equal to 1700 Å.

Here, the cavity length of the microcavity refers to a distance between a surface of the first electrode proximate to the first light-emitting layer and a surface of the second electrode proximate to the first light-emitting layer in a direction perpendicular to the display substrate. That is, the distance between the surface of the first electrode proximate to the first light-emitting layer and the surface of the second electrode proximate to the first light-emitting layer is greater than or equal to 750 Å and is less than or equal to 1700 Å. For example, the cavity length of the microcavity may be 850 Å, 900 Å, 1000 Å, etc.

The Illuminance L0 of natural light that is most healthy and comfortable for the human eyes is usually 120 Lx to 150 Lx. In a case where the brightness LP in a vertical direction of the screen is 300 nit, and the reflectance R % of the screen is 8%, the contrast CR of the ambient light of the screen is CR=LP/(L0*R %)=25:1. In a case where the viewing angle is 30°, the CR reaches 12:1, and light exiting from the screen at this viewing angle may not basically image a clear display image. In a case where the viewing angle is 45°, the brightness ratio decreases to 20%, the CR becomes 5:1, and light exiting from the screen at this viewing angle may not totally image a clear display image. In a case where the viewing angle is 60°, the brightness ratio decreases below 10%, the CR decreases to 2:1, and light exiting from the screen at this viewing angle is almost free of blue light, which may cause the contents of the display image on the screen not to be recognized by the human eyes normally, thereby achieving an effect of anti-peep display.

In some embodiments of the present disclosure, a thickness of the second electrode 40 may be greater than or equal to 200 Å and is less than or equal to 500 Å.

Figure 12:
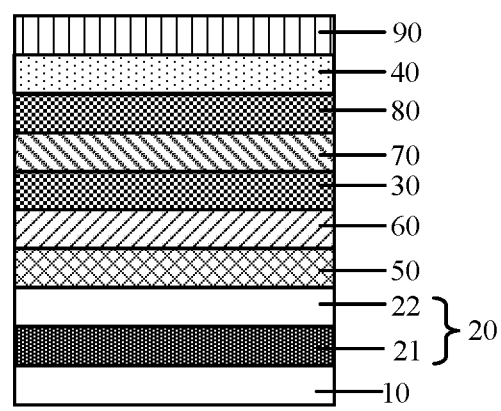
FIG. 12 is a schematic diagram showing a cross-sectional structure of another display substrate, in accordance with some embodiments of the present disclosure.

In some embodiments of the present disclosure, as shown in FIG. 12, the display substrate further includes a polarizing layer 90 disposed on a side of the blue light-emitting unit away from the base 10. The distance between the surface of the first electrode 21 proximate to the first light-emitting layer 30 and the surface of the second electrode 40 proximate to the first light-emitting layer 30 is greater than or equal to 800 Å and is less than or equal to 1750 Å. That is, the cavity length of the microcavity is greater than or equal to 800 Å and is less than or equal to 1750 Å. For example, the cavity length of the microcavity may be 850 Å, 900 Å, 1000 Å, 1720 Å, etc.

The polarizing layer 90 may be, for example, a polarizer, or a wire grid polarizing layer.

For example, the polarizing layer 90 may be disposed on a side of the first anode 20 away from the base 10, or may be disposed on a side of a thin film encapsulating layer covering the blue light-emitting unit away from the base 10. In a case where the display substrate is encapsulated by the encapsulating cover plate, the polarizing layer 90 may also be disposed on a side of the encapsulating cover plate away from the base 10.

Figure 13:
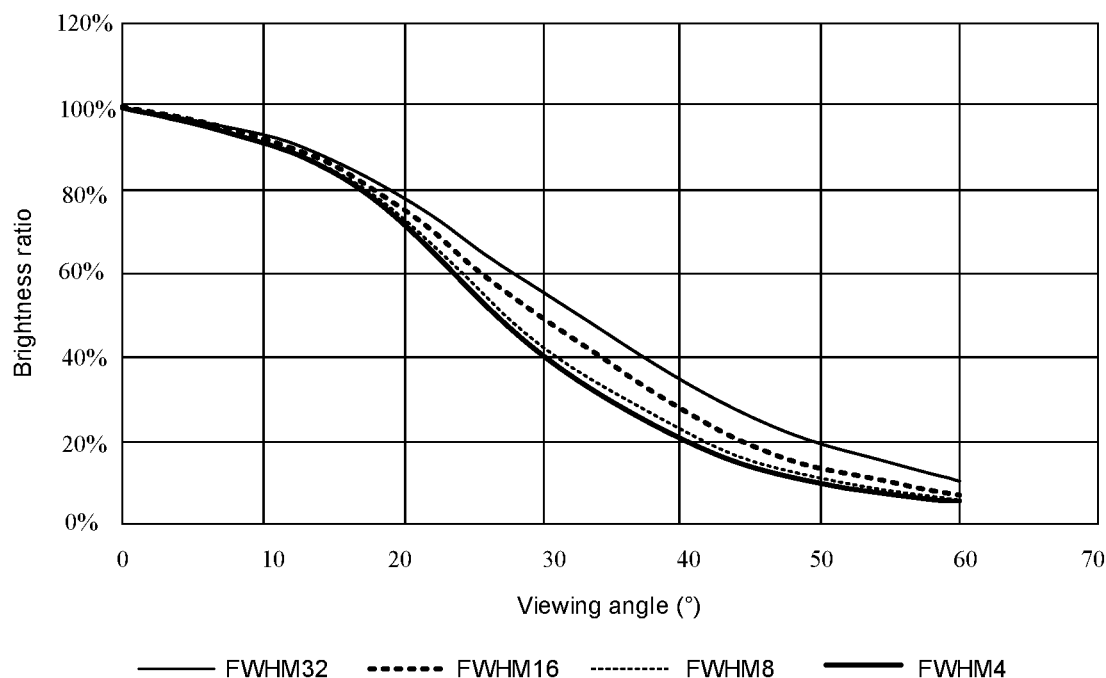
FIG. 13 is a graph showing another relationship between a viewing angle and a brightness ratio, in accordance with some embodiments of the present disclosure.

In a case where the display substrate is provided with the polarizing layer 90, and the cavity length of the microcavity is greater than or equal to 800 Å and is less than or equal to 1750 Å, the luminous intensity of light in the vertical light exit direction of the display substrate is the largest. As shown in FIG. 13, as the viewing angle increases, in a case where the FWHM is 32 nm, 16 nm, 8 nm, or 4 nm (labeled as FWHM32, FWHM16, FWHM8, and FWHM4 respectively in FIG. 13), the brightness ratios corresponding to the viewing angle each gradually decrease. In a case where the FWHMs are 16 nm, 8 nm, and 4 nm, the brightness ratios have a similar decreasing trend. That is, as the viewing angle increases, on one hand, the brightness ratios for the FWHMs of 16 nm, 8 nm and 4 nm are close at a same viewing angle. On the other hand, decreasing ratios of the brightness ratios for the FWHMs of 16 nm, 8 nm and 4 nm are larger compared to a decreasing ratio of the brightness ratio for the FWHM of 32 nm. For example, in a case where the viewing angle is 20° to 60° or greater, the brightness ratios for the FWHMs of 16 nm, 8 nm and 4 nm are much smaller than the brightness ratio for the FWHM of 32 nm at a same viewing angle.

For example, the illuminance L0 of natural light that is most healthy and comfortable for the human eyes is usually 120 Lx to 150 Lx. In a case where the brightness LP in a vertical direction of the screen is 200 nit, and the reflectance R % of the screen is less than 5% (usually 2% to 3%), the contrast CR of the ambient light of the screen is CR=LP/(L0*R %)=80:1. In a case where the viewing angle is 45, the brightness ratio decreases to 15%, the CR becomes 12:1, and light exiting from the screen at this viewing angle may not totally image a clear display image. In a case where the viewing angle is 60°, the brightness ratio decreases below 10%, the CR decreases to 7:1, and light exiting from the screen at this viewing angle is almost free of blue light, which may cause the contents of the display image on the screen not to be recognized by the human eyes normally, thereby achieving the effect of anti-peep display.

In some embodiments of the present disclosure, in order to form a strong microcavity effect, that is, to make a range of the wavelength λ of light emitted from the light-emitting unit 11 become small as possible, a thickness of the second electrode 40 may be greater than or equal to 300 Å and is less than or equal to 350 Å, such as 310 Å, 320 Å, 330 Å, or 340 Å, and a thickness of the first electrode 21 may be greater than or equal to 1000 Å and is less than or equal to 1500 Å, such as 1100 Å, 1200 Å, 1300 Å, or 1400 Å. In order to form the strong microcavity effect, the thickness of the first electrode 21 and the thickness of the second electrode 40 may be set to make the cavity length of the microcavity satisfy the condition that: in a case where no polarizer is provided, the cavity length of the microcavity is greater than or equal to 750 Å and is less than or equal to 1700 Å; in a case where the polarizer is provided, the cavity length of the microcavity is greater than or equal to 800 Å and less than or equal to 1750 Å.

Optionally, in order to adjust the cavity length of the microcavity, in some embodiments of the present disclosure, the display substrate may further include a thickness adjustment layer. The thickness adjustment layer may be disposed between the first anode 20 and the transmission electrode 22. The thickness adjustment layer may be made of silicon nitride. The thickness adjustment layer makes the blue light-emitting unit 11 satisfy the condition that: in a case where no polarizer is provided, the cavity length of the microcavity is greater than or equal to 750 Å and is less than or equal to 1700 Å; in a case where the polarizer is provided, the cavity length of the microcavity is greater than or equal to 800 Å and is less than or equal to 1750 Å.

In some embodiments of the present disclosure, the position of the light-emitting layer in the microcavity will affect the brightness of light emitted by the light-emitting layer. Light emitted by the light-emitting layer will form a stationary wave in the microcavity. According to the electromagnetic theory, in a case where a light-emitting position of the light-emitting layer is disposed at an anti-node of the stationary wave (i.e., an anti-node of the stationary wave, a position of the largest amplitude in the stationary wave), the microcavity effect may be strengthened to enhance the luminous intensity of the light-emitting unit, thereby improving a luminous efficiency of the display panel and the display apparatus.

Figure 11:
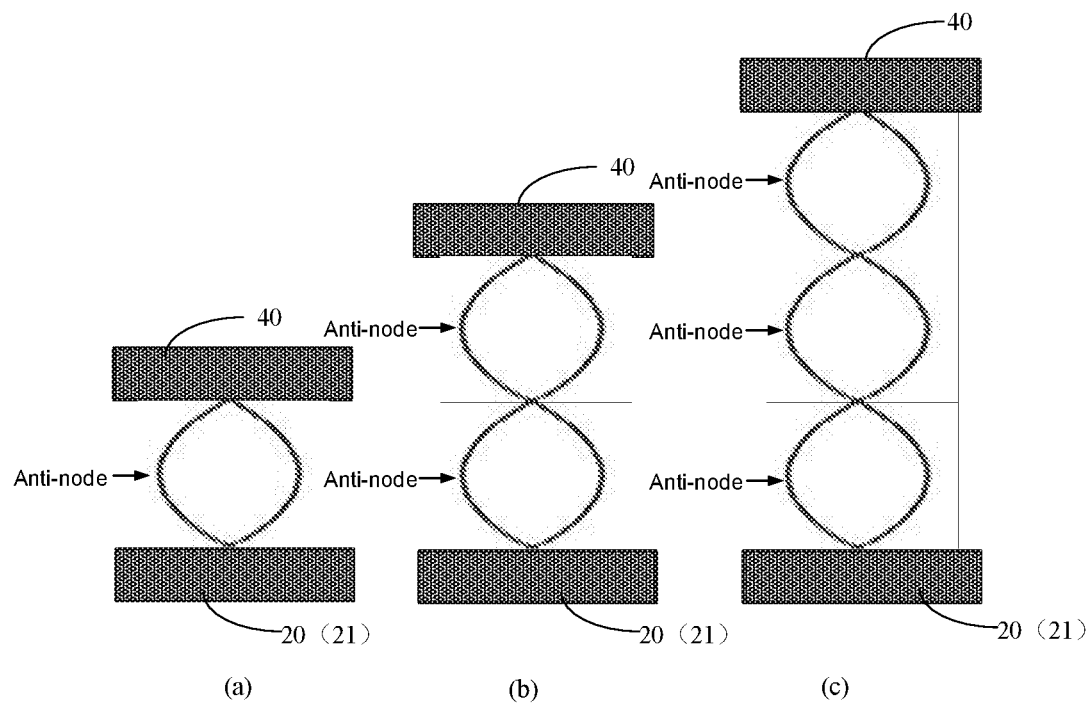
FIG. 11 is a graph showing a correspondence relationship between a cavity length and anti-node(s) in a display substrate, in accordance with some embodiments of the present disclosure.

For example, as shown in FIG. 11, the microcavity is a cavity-shaped structure formed between the second electrode 40 and the first electrode 21 (or the first anode 20). In a case where the cavity lengths of the microcavities are different, the number of anti-nodes of the stationary waves formed in the microcavities by light emitted by the light-emitting layer is different. Three parts a, b and c in FIG. 11 represent vibration waveform diagrams of the stationary waves in the microcavities with different cavity lengths, respectively. In FIG. 11, there is one anti-node in the vibration waveform diagram of the stationary wave in the microcavity shown in part a, there are two anti-nodes in the vibration waveform diagram of the stationary wave in the microcavity shown in part b, and there are three anti-nodes in the vibration waveform of the stationary wave in the microcavity shown in part c.

As shown in part a in FIG. 11, in the microcavity, in a case where the cavity length of the microcavity allows one anti-node to exist in the microcavity, the anti-node is a first anti-node. The light-emitting layer (such as the first light-emitting layer) is provided at the first anti-node, which may strengthen the microcavity effect. However, in this case, an optical path of the light-emitting unit (such as the blue light-emitting unit) is short, which results in a small total thickness of the light-emitting unit. Therefore, it is possible to cause an electric leakage of the light-emitting unit, and to affect yield of the light-emitting unit.

As shown in part c in FIG. 11, in the microcavity, in a case where the cavity length of the microcavity allows three anti-nodes to exist in the microcavity, the anti-nodes include a first anti-node, a second anti-node, and a third anti-node in a sequence from near to far relative to the first electrode 21 (or the first anode 20). The light-emitting layer is provided at the third anti-node, which may strengthen the microcavity effect. However, the microcavity with three anti-nodes has a large thickness, which may result in a large total thickness of the light-emitting unit and a high voltage of a light-emitting unit, thereby affecting yield of the light-emitting unit.

Based on this, in some embodiments of the present disclosure, as shown in part b in FIG. 11, in a case where the cavity length of the microcavity allows two anti-nodes to exist in the microcavity, the anti-nodes include a first anti-node and a second anti-node in a sequence from near to far relative to the first electrode 21 (or the first anode 20). The first light-emitting layer 30 is provided at the second anti-node (the anti-node in part b in FIG. 11 closer to the second electrode 40) in the microcavity, which may strengthen the microcavity effect. In this case, the first light-emitting layer 30 is disposed at the second anti-node of the stationary wave, and the light-emitting unit has large light-emitting brightness and an optimal total thickness.

In a case where the first light-emitting layer 30 is disposed at the second anti-node in the microcavity, if the cavity length of the microcavity is greater than or equal to 750 Å and is less than or equal to 1750 Å, a distance between a surface of the first light-emitting layer 30 proximate to the base 10 and a surface of the first electrode 21 (or the transmission electrode 22) away from the base 10 satisfies the condition that: it is greater than or equal to 250 Å and less than or equal to 1200 Å.

For example, the transmission electrode 22 is provided in the light-emitting unit. In a case where the cavity length of the microcavity is 1750 Å, a distance between the second anti-node and the surface of the transmission electrode 22 away from the base 10 is 1050 Å.

For example, the transmission electrode 22 is provided in the light-emitting unit. In a case where the cavity length of the microcavity is 1700 Å, the distance between the second anti-node and the surface of the transmission electrode 22 away from the base 10 is 1000 Å.

Hereinafter, the specific structure of the display substrate provided by some embodiments of the present disclosure will be described with specific embodiments.

In some embodiments of the present disclosure, as shown in FIG. 10, a display substrate is provided. The display substrate includes blue light-emitting units 1000 disposed on a base 10. The blue light-emitting unit 1000 includes a first anode 20, a first light-emitting layer 30, and a second electrode 40 that are sequentially disposed on the base 10. The first anode 20 includes a first electrode 21 and a transmission electrode 22 that are sequentially arranged in a direction away from the base. A microcavity is formed between the first electrode 21 and the second electrode 40. A FWHM of a spectrum of light emitted by the first light-emitting layer 30 is less than or equal to 16 nm.

The display substrate further includes a hole injection layer 50 and a hole transport layer 60 that are sequentially arranged between the first electrode 20 and the first light-emitting layer 30. The display substrate further includes an electron transport layer 70 and an electron injection layer 80 that are sequentially arranged between the first light-emitting layer 30 and the second electrode 40.

A cavity length of the microcavity is equal to 1700 Å. A thickness of the first electrode 21 is 1000 Å. A thickness of the transmission electrode 22 is 120 Å. A thickness of the hole injection layer 50 is 980 Å. A thickness of the hole transport layer 60 is 100 Å. A thickness of the first light-emitting layer 30 is 250 Å. A thickness of the electron transport layer 70 is 200 Å. A thickness of the electron injection layer 80 is 50 Å. A thickness of the second electrode 40 is 200 Å.

In a case where a viewing angle of a human eye watching the display substrate is 30°, a brightness ratio may decrease below 50%. In a case where the viewing angle is 45°, the brightness ratio may decrease to 20%. In a case where the viewing angle is 60°, the brightness ratio may decrease below 10%. The illuminance L0 of the ambient light is usually 120 Lx to 150 Lx, the brightness LP in a vertical direction of the display screen (i.e., the screen) is usually 300 nit, the reflectance R % is usually 8%, and the contrast CR of the ambient light of the screen is CR=LP/(L0*R %). Therefore, as the viewing angle increases, the CR may decrease to 20%, and even to 10%, so as to achieve an anti-peep function under different viewing angles.

In some embodiments of the present disclosure, as shown in FIG. 12, the display substrate includes blue light-emitting units disposed on a base 10. The blue light-emitting unit includes a first anode 20, a first light-emitting layer 30, and a second electrode 40 that are sequentially disposed on the base 10. The first anode 20 includes a first electrode 21 and a transmission electrode 22. A microcavity is formed between the first electrode 21 and the second electrode 40. A FWHM of a spectrum of light emitted by the first light-emitting layer 30 is less than or equal to 16 nm.

The display substrate further includes a hole injection layer 50 and a hole transport layer 60 that are sequentially arranged between the first anode 20 and the first light-emitting layer 30. The display substrate further includes an electron transport layer 70 and an electron injection layer 80 that are sequentially arranged between the first light-emitting layer 30 and the second electrode 40.

The display substrate further includes a polarizing layer 90 disposed on a side of the blue light-emitting unit away from the base 10.

A cavity length of the microcavity is equal to 1750 Å. A thickness of the first electrode 21 is 1000 Å. A thickness of the transmission electrode 22 is 120 Å. A thickness of the hole injection layer 50 is 1030 Å. A thickness of the hole transport layer 60 is 100 Å. A thickness of the first light-emitting layer 30 is 250 Å. A thickness of the electron transport layer 70 is 130 Å. A thickness of the electron injection layer 80 is 120 Å. A thickness of the second electrode 40 is 300 Å.

In a case where a viewing angle of a human eye watching the display substrate is 45°, a brightness ratio may decrease to 15%. In a case where the viewing angle is 60°, the brightness ratio may decrease below 10%. The illuminance L0 of the ambient light is usually 120 Lx to 150 Lx, the brightness LP in a vertical direction of the display screen is usually 200 nit, the reflectance R % is usually 5% to 8%, and the contrast CR of the ambient light of the screen is CR=LP/(L0*R %). Therefore, as the viewing angle increases, the CR may decrease to 20%, and even to 10%, so as to achieve an anti-peep function under different viewing angles.

Figure 14:
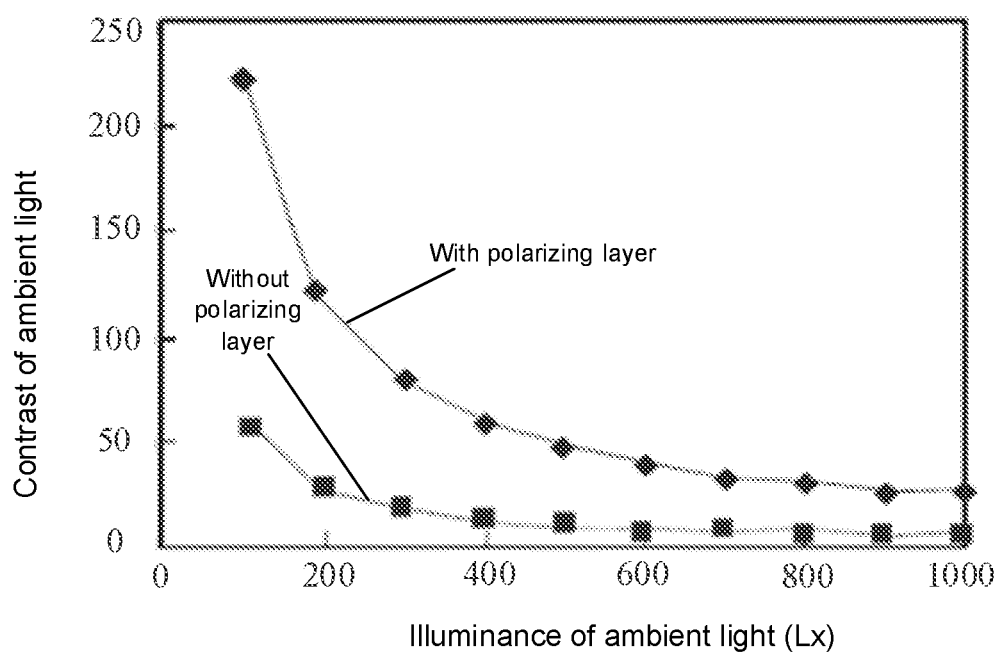
FIG. 14 is a graph showing a relationship between a contrast of ambient light and an illumination intensity of the ambient light when a display substrate is provided with and without a polarizing layer, in accordance with some embodiments of the present disclosure.

From the above, it can be understood that the contrast CR of the ambient light of the screen is related to the illuminance L0 of the ambient light, and the illuminance L0 of the ambient light may be reasonably selected according to needs. As shown in FIG. 14, FIG. 14 shows a graph showing a relationship between a contrast CR of ambient light and an illumination intensity L0 of the ambient light when a display substrates is provided with and without a polarizing layer in the ambient light in some embodiments of the present disclosure.

The arrangement of the light-emitting layer in the light-emitting unit is introduced above only in an example where the light exit mode of the light-emitting unit is the top emission mode. It can be understood that in a case where the light exit mode of the light-emitting unit is the bottom emission mode, an arrangement of the light-emitting layer in the light-emitting unit is similar to that of the top emission, which may be referred to the arrangement of the light-emitting layer in the light-emitting unit whose light exit mode is the top emission mode.

Figure 15:
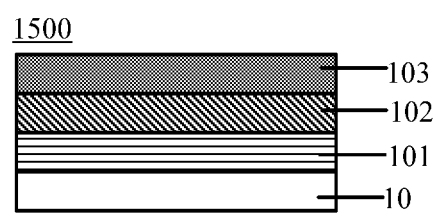
FIG. 15 is a schematic diagram showing a cross-sectional structure of a red light-emitting unit of a display substrate, in accordance with some embodiments of the present disclosure.

In some embodiments of the present disclosure, as shown in FIG. 15, the display substrate 210 may further include red light-emitting units 1500. The red light-emitting unit 1500 includes a third electrode 101, a second light-emitting layer 102, and a fourth electrode 103 that are sequentially disposed on the base 10. Light emitted by the second light-emitting layer 102 is red light.

Figure 16:
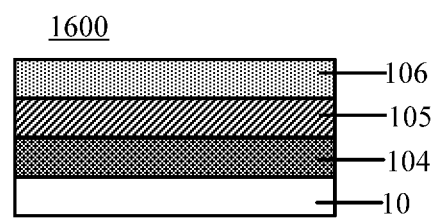
FIG. 16 is a schematic diagram showing a cross-sectional structure of a green light-emitting unit of a display substrate, in accordance with some embodiments of the present disclosure.

In some embodiments of the present disclosure, as shown in FIG. 16, the display substrate 210 may further include green light-emitting units 1600. The green light-emitting unit 1600 includes a fifth electrode 104, a third light-emitting layer 105, and a sixth electrode 106 that are sequentially disposed on the base 10. Light emitted by the third light-emitting layer 105 is green light.

In order to simplify the manufacturing process, in some embodiments of the present disclosure, the first electrode, the third electrode, and the fifth electrode in the display substrate are an integrated structure. That is, the first electrodes in the blue light-emitting units, the third electrodes in the red light-emitting units, and the fifth electrodes in the green light-emitting units are connected to each other to form an entire electrode layer.

It can be understood that, in a case where the first electrode is the first anode, the third electrode is also correspondingly an anode in the red light-emitting unit, and the fifth electrode is also correspondingly an anode in the green light-emitting unit. That is, the anodes in the light-emitting units are in a same layer and are made of a same material.

In a case where the blue light-emitting unit further includes the transmission electrode 22 disposed on a side of the first electrode 21 proximate to the first light-emitting layer 30, the red light-emitting unit also correspondingly includes a transmission electrode disposed on a side of the third electrode proximate to the second light-emitting layer. Similarly, the green light-emitting unit also correspondingly includes a transmission electrode disposed on a side of the fifth electrode proximate to the third light-emitting layer.

That is, in each red light-emitting unit, the third electrode and the transmission electrode in the red light-emitting unit together constitute the anode of the red light-emitting unit. In each green light-emitting unit, the fifth electrode and the transmission electrode in the green light-emitting unit together constitute the anode of the green light-emitting unit.

For example, in a case where the first electrode, the third electrode, and the fifth electrode in the display substrate are an integrated structure, the transmission electrodes in the light-emitting units are also an integrated structure.

In order to simplify the manufacturing process, in some other embodiments of the present disclosure, the second electrode, the fourth electrode, and the sixth electrode are an integrated structure. That is, the second electrodes in the blue light-emitting units, the fourth electrodes in the red light-emitting units, and the sixth electrodes in the green light-emitting units are connected to each other to form an entire electrode layer.

It can be understood that, in a case where the second electrode is a cathode, the fourth electrode is also correspondingly a cathode in the red light-emitting unit, and the sixth electrode is also correspondingly a cathode in the green light-emitting unit. That is, the cathodes in the light-emitting units are in a same layer and are made of a same material.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, comprising:
   a base, and
   blue light-emitting units disposed on the base, wherein
   a blue light-emitting unit includes a first electrode, a transmission electrode, a first light-emitting layer and a second electrode that are sequentially disposed on the base;
   the first electrode is configured to reflect light, and the second electrode is configured to transmit light;
   the first light-emitting layer is configured to emit light having a spectrum whose full width at half maximum is less than or equal to 16 nm; and the first light-emitting layer is disposed at a position where a second anti-node is located between a surface of the first electrode proximate to the first light-emitting layer and a surface of the second electrode proximate to the first light-emitting layer; and
   a distance between the second anti-node and a surface of the transmission electrode away from the base is 1000 Å.

2. The display substrate according to claim 1, wherein a thickness of the first light-emitting layer is 200 Å to 300 Å.

3. The display substrate according to claim 1, wherein in a direction perpendicular to the display substrate, a distance between the surface of the first electrode proximate to the first light-emitting layer and the surface of the second electrode proximate to the first light-emitting layer is 1700 Å.

4. The display substrate according to claim 3, wherein a thickness of the second electrode is greater than or equal to 200 Å and is less than or equal to 500 Å.

5. The display substrate according to claim 4, wherein the second electrode includes a magnesium-silver alloy or a calcium-silver alloy.

6. The display substrate according to claim 1, further comprising a polarizing layer disposed on a side of the blue light-emitting unit away from the base.

7. The display substrate according to claim 6, wherein a thickness of the second electrode is greater than or equal to 300 Å and is less than or equal to 350 Å.

8. The display substrate according to claim 1, wherein a distance between a surface of the first light-emitting layer proximate to the base and the surface of the first electrode proximate to the first light-emitting layer is greater than or equal to 250 Å and is less than or equal to 1200 Å.

9. The display substrate according to claim 1, wherein a thickness of the first electrode is greater than or equal to 1000 Å and is less than or equal to 1500 Å.

10. The display substrate according to claim 1, wherein the first electrode includes at least one of silver, aluminum, copper, molybdenum, chromium, and titanium.

11. The display substrate according to claim 1, wherein the blue light-emitting unit further includes a hole injection layer and/or a hole transport layer that are disposed between the first electrode and the first light-emitting layer.

12. The display substrate according to claim 1, wherein the blue light-emitting unit further includes:
   an electron transport layer and/or an electron injection layer that are disposed between the first light-emitting layer and the second electrode.

13. The display substrate according to claim 1, further comprising red light-emitting units and green light-emitting units, wherein
- a red light-emitting unit includes a third electrode, a second light-emitting layer, and a fourth electrode that are sequentially disposed on the base;
- a green light-emitting unit includes a fifth electrode, a third light-emitting layer, and a sixth electrode that are sequentially disposed on the base.

14. The display substrate according to claim 13, wherein
the first electrode, the third electrode, and the fifth electrode are an integrated structure; or, the second electrode, the fourth electrode, and the sixth electrode are an integrated structure.

15. A display panel, comprising the display substrate according to claim 1.

16. The display panel according to claim 15, further comprising an encapsulating cover plate disposed opposite to the base; or, a thin film encapsulating layer disposed opposite to the base.

17. A display apparatus, comprising the display panel according to claim 15.

18. A display substrate, comprising:
a base, and
blue light-emitting units disposed on the base, wherein
- a blue light-emitting unit includes a first electrode, a transmission electrode, a first light-emitting layer and a second electrode that are sequentially disposed on the base;
- the first electrode is configured to reflect light, and the second electrode is configured to transmit light;
- the first light-emitting layer is configured to emit light having a spectrum whose full width at half maximum is less than or equal to 16 nm; and the first light-emitting layer is disposed at a position where a second anti-node is located between a surface of the first electrode proximate to the first light-emitting layer and a surface of the second electrode proximate to the first light-emitting layer; and
- a distance between the second anti-node and a surface of the transmission electrode away from the base is 1050 Å.

19. A display panel, comprising the display substrate according to claim 18.

20. A display apparatus, comprising the display panel according to claim 19.

* * * * *